(12) United States Patent
Liao et al.

(10) Patent No.: US 8,827,723 B2
(45) Date of Patent: Sep. 9, 2014

(54) ELECTRICAL CONNECTOR ASSEMBLY HAVING SHIELDING DEVICE FOR EMI THEREOF

(71) Applicants: Fang-Jwu Liao, New Taipei (TW); Chun-Yi Chang, New Taipei (TW)

(72) Inventors: Fang-Jwu Liao, New Taipei (TW); Chun-Yi Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 60 days.

(21) Appl. No.: 13/733,042

(22) Filed: Jan. 2, 2013

(65) Prior Publication Data
US 2014/0038437 A1 Feb. 6, 2014

(51) Int. Cl.
*H01R 13/62* (2006.01)
*H05K 9/00* (2006.01)
*H01R 13/6594* (2011.01)
*H05K 7/10* (2006.01)
*H01R 13/658* (2011.01)

(52) U.S. Cl.
CPC .............. *H01R 13/62* (2013.01); *H05K 9/0032* (2013.01); *H01R 13/6594* (2013.01); *H05K 7/1061* (2013.01); *H01R 13/658* (2013.01)
USPC ........................................ 439/73; 439/607.55

(58) Field of Classification Search
CPC ............................ H01R 13/62; H01R 13/6594
USPC ............ 439/73, 331, 607.01, 607.22, 607.55
See application file for complete search history.

(56) References Cited

U.S. PATENT DOCUMENTS

| | | | | |
|---|---|---|---|---|
| 5,797,771 | A * | 8/1998 | Garside | 439/607.46 |
| 6,205,026 | B1 * | 3/2001 | Wong et al. | 361/704 |
| 6,570,763 | B1 * | 5/2003 | McHugh et al. | 361/704 |
| 7,077,664 | B1 * | 7/2006 | Wang et al. | 439/70 |
| 7,077,680 | B1 * | 7/2006 | Wang et al. | 439/331 |
| 7,147,481 | B2 * | 12/2006 | Yang | 439/71 |
| 7,160,116 | B2 * | 1/2007 | Li | 439/73 |
| 7,280,362 | B2 * | 10/2007 | Hood et al. | 361/719 |
| 7,335,030 | B2 * | 2/2008 | Kunioka et al. | 439/73 |
| 7,909,631 | B2 * | 3/2011 | Ma | 439/331 |
| 8,342,870 | B2 * | 1/2013 | Hsieh et al. | 439/331 |
| 2007/0275574 | A1 * | 11/2007 | Lien | 439/73 |
| 2012/0108096 | A1 | 5/2012 | Yeh | |
| 2014/0073165 | A1 * | 3/2014 | Chang | 439/342 |

* cited by examiner

*Primary Examiner* — James Harvey
(74) *Attorney, Agent, or Firm* — Wei Te Chung; Ming Chieh Chang

(57) ABSTRACT

An electrical connector assembly for electrically connecting a central processing unit (CPU) to a printed circuit board (PCB), includes an electrical connector and a shield device. The electrical connector includes an insulative housing, a number of contacts received in the insulative housing, and a load plate mounted upon the insulative housing. The shield device includes an upper section providing a loading force to the load plate, and side sections located on four sides of the electrical connector.

16 Claims, 5 Drawing Sheets

ELECTRICAL CONNECTOR ASSEMBLY HAVING SHIELDING DEVICE FOR EMI THEREOF

BACKGROUND OF THE INVENTION

1. Field of the Invention

The present invention relates to an electrical connector assembly for electrically connecting a Central Processing Unit (CPU) to a printed circuit board (PCB), especially to an electrical connector assembly with a metallic shielding device for avoiding electromagnetic interference (EMI) and providing another loading force to the CPU.

2. Description of Related Art

U.S. patent application publication No. 20120108096 issued to Yeh on May 3, 2012 discloses an electrical connector including an insulative housing having a base and a plurality of periphery walls extending upward from the base to define an inner cavity. A fastening assembly includes a retention plate pivotally assembled with a rear end of the insulative housing and a latch assembled at a front end of the insulative housing, the latch including a retention arm assembled in the periphery wall, a linking portion extending upwardly from the retention arm, and a handle portion extending from the linking portion and having a bottom surface locking the retention plate and a top surface for operating.

However, the latch of above said electrical connector has a loose engaging with the retention plate and can not provide enough loading force to the CPU. Therefore, there is not a well electrical connection established between the CPU and the electrical connector.

Hence, it is desirable to provide an improved electrical connector to overcome the aforementioned disadvantages.

SUMMARY OF THE INVENTION

Accordingly, an object of the present invention is to provide an electrical connector assembly with a metallic shielding device shrouding an electronic connector to avoid electromagnetic interference (EMI) and provide another loading force for a Central Processing Unit (CPU).

According to one aspect of the present invention, there is provided an electrical connector assembly for electrically connecting a CPU to a printed circuit board (PCB), comprises an electrical connector and a shield device. The electrical connector comprises an insulative housing, a plurality of contacts received in the insulative housing, and a load plate mounted upon the insulative housing. The shield device comprises an upper section providing a loading force to the load plate, and side sections located on four sides of the electrical connector.

According to another aspect of the present invention, there is provided an electrical connector assembly used for providing loading force to a CPU, comprises a printed circuit board (PCB), an electrical connector, and a shield device. The electrical connector is mounted upon the PCB and comprises an insulative housing, a plurality of contacts received in the insulative housing, and a load plate mounted upon the insulative housing. The shield device is mounted on the PCB and cooperated with the PCB to form a closed space to receive the electrical connector therein. The shield device exerts a loading force to the load plate.

Other objects, advantages and novel features of the invention will become more apparent from the following detailed description of a preferred embodiment when taken in conjunction with the accompanying drawings.

DETAILED DESCRIPTION OF THE INVENTION

Reference will now be made to the drawings to describe the present invention in detail.

Figure 1:
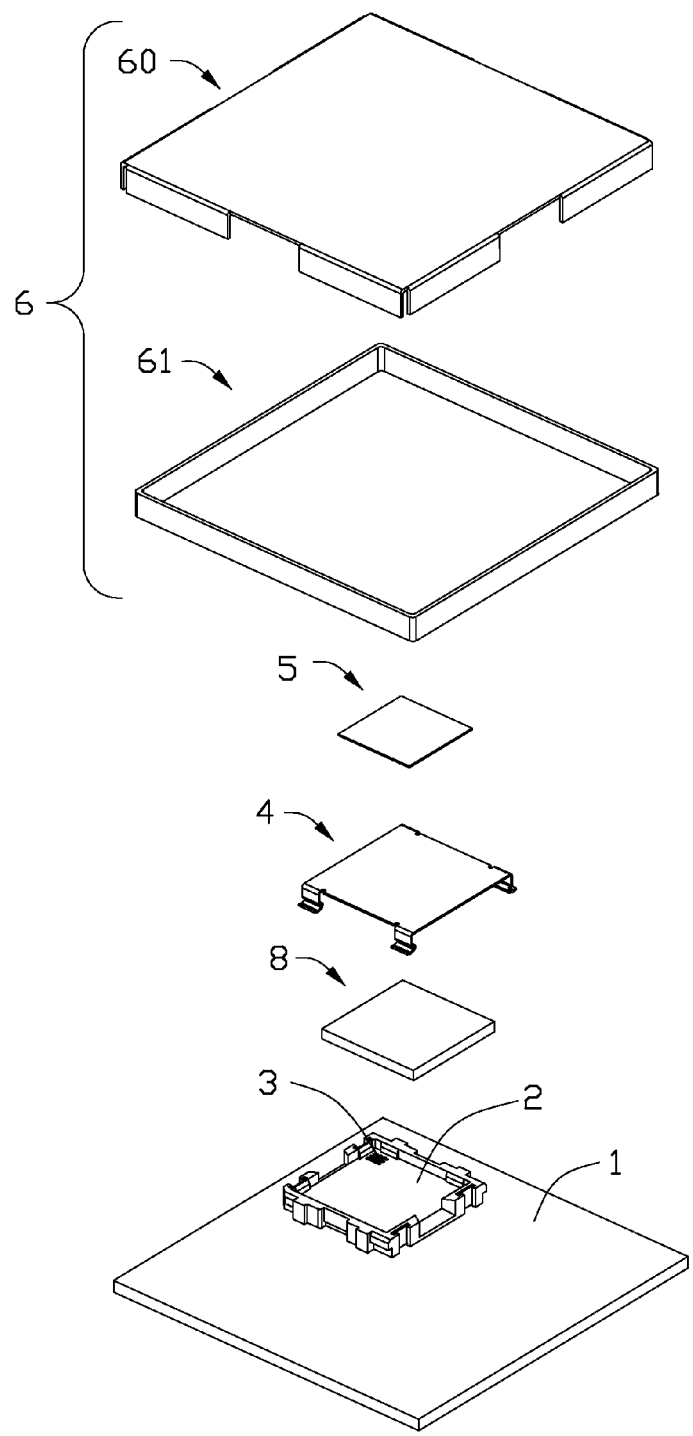
FIG. 1 is an exploded, perspective view of an electrical connector assembly in accordance with the present invention.
Figure 2:
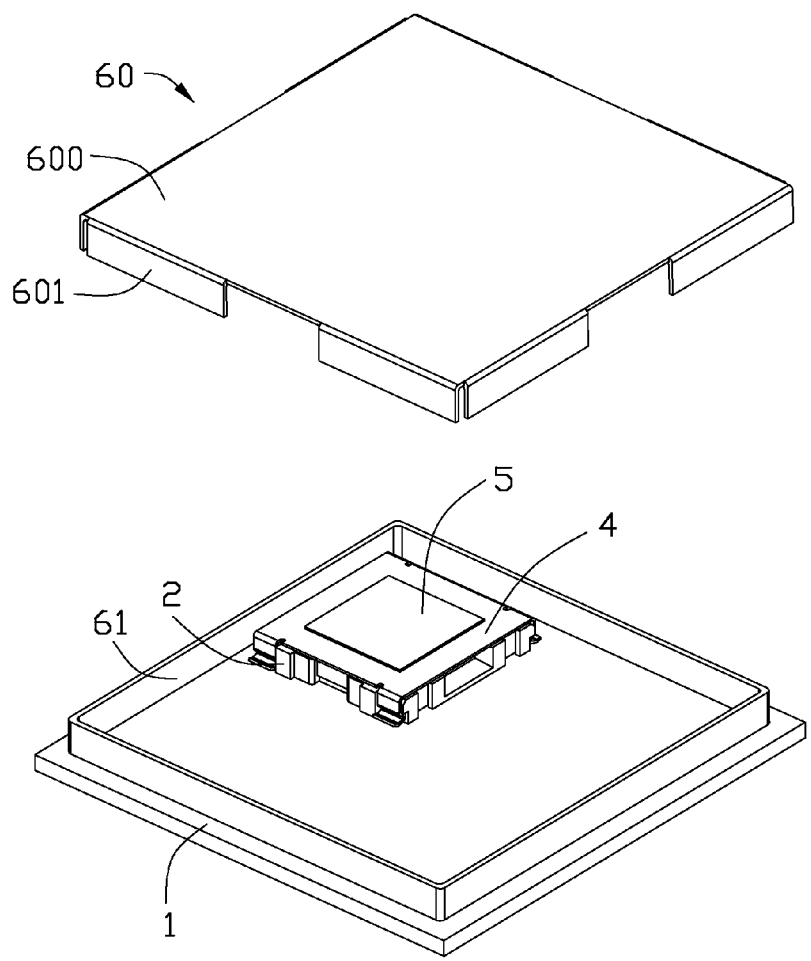
FIG. 2 is a perspective view of the electrical connector assembly shown in FIG. 1, wherein the shielding device is at the open position.
Figure 3:
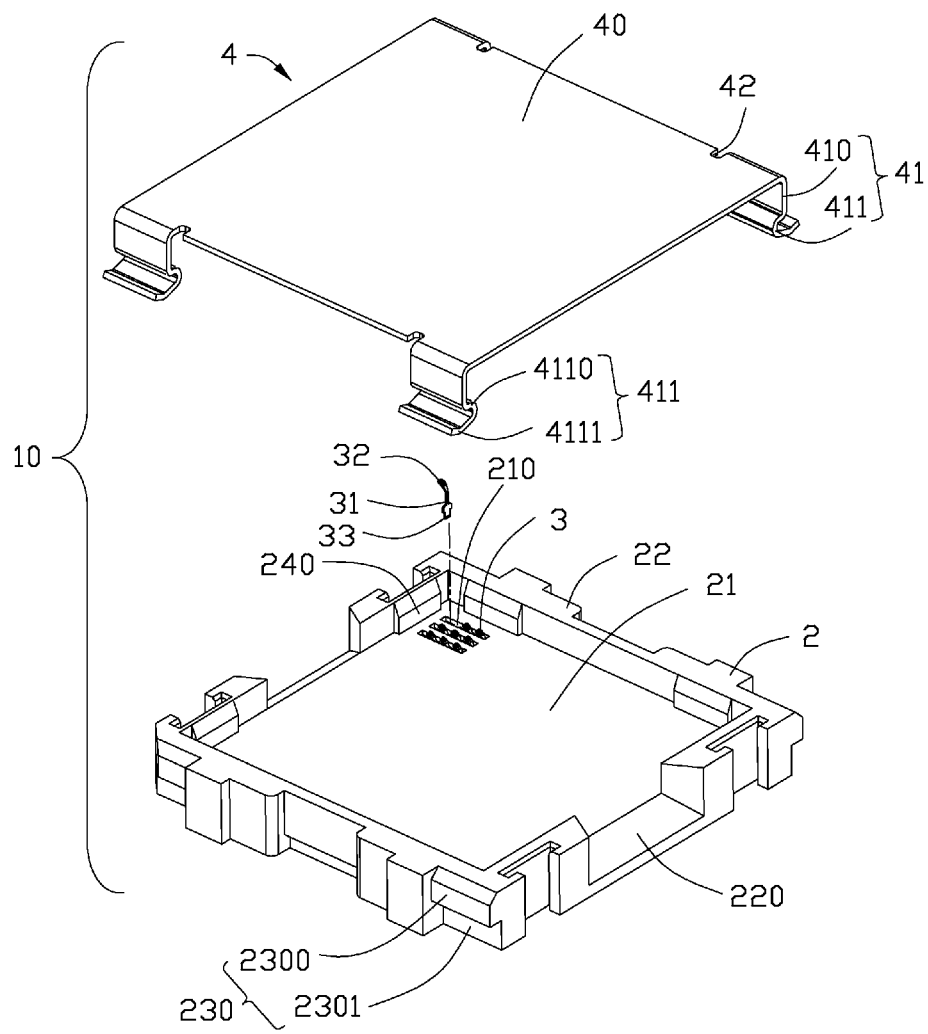
FIG. 3 is an exploded, perspective view of an electrical connector.

FIGS. 1-3 illustrate an electrical connector assembly of the present invention for electrically connecting a central processing unit (CPU) 8, comprises an electrical connector 10. The electrical connector 10 is a land grid array (LGA) type connector and comprises an insulative housing 2, a load plate 4 mounted upon the insulative housing 2, and a plurality of contacts 3 received in the insulative housing 2. The electrical connector assembly further includes a printed circuit board (PCB) 1, a shield device 6, and a thermal pad 5 disposed between the shield device 6 and the load plate 4.

Referring to FIG. 1, the insulative housing 2 has a substantially rectangular shape and includes a base 21 and a plurality of sidewalls 22 extending upwardly from the base 21. The base 21 defines a plurality of passageways 210 to receive the contacts 3, and each contact 3 includes a retention portion 31 fixed in the passageway 210, a mating portion 32 extending beyond the base 21 to contact with CPU 8, and a soldering portion 33 extending downwardly from the retention portion 31 for connecting with the PCB 1. One pair of the sidewalls 22 define recesses 220 for conveniently removing the CPU 8. Another pair of the sidewalls 22 has two pair of receiving portions 230, each receiving portion 230 includes a projection 2300 extending outwardly from the sidewall 22 and a notch 2301 formed below the projection 2300. In addition, two adjacent inner sides of the sidewalls 22 define a plurality of datums 240 for correct and steady leading the CPU 8 in the insulative housing 2.

The load plate 4 includes a planar solid main body 40 and two pair of latches 41 extending downwardly from two opposite sides of the main body 40. A gap 42 is defined on the main body 40 and adjacent the latch 41 for the latch 41 having better flexibility. The latch 41 includes a connecting portion 410 extending downwardly from the main body 40 and a bent portion 411 bent toward the inner space below the main body 40. The bent portion 411 includes an against surface 4110 near the connecting portion 410 and an end portion 4111 extending away from the inner space below the main body 40, and the end portion 4111 can be bent upwardly at the free end for operating easily to pick up the load plate 4 from the insulative housing 2. In the instant invention, the load plate 4 is mounted upon the insulative housing 2 on the condition that the bent portion 411 is located in the notch 2301 and the against surface 4110 is against the bottom surface of the projection 2300 so as to the load plate 4 can exert a loading force to the CPU 8 to establish an electrical connection between the CPU 8 and the contacts 3.

Figure 4:
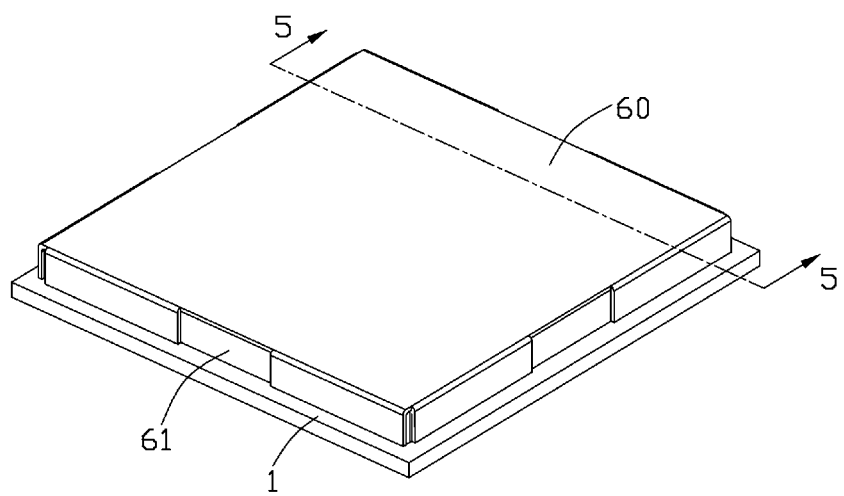
FIG. 4 is an assembled view of the electrical connector assembly shown in FIG. 1.

The shield device 6 is made by metallic material and configured by an upper section and side sections to form a closed space to receive the electrical connector 10 for avoiding electromagnetic interference (EMI). In the instant invention, the shield device 6 includes a cover 60 and a frame 61. The cover 60 is configured by an upper plate 600 and sidewalls 601, and the frame 61 is formed by vertical sidewalls, the sidewalls 601 and the frame 61 commonly formed the side sections of the shield device 6. Referring to FIG. 4, the cover 60 is mounted on the outside of the frame 61. The cover 60 and the frame 61 are connected by adhibition or hooks defined therebetween. The shield device 6 also can be adhibit to the PCB 1 or use other method mounted to the PCB 1.

Figure 5:
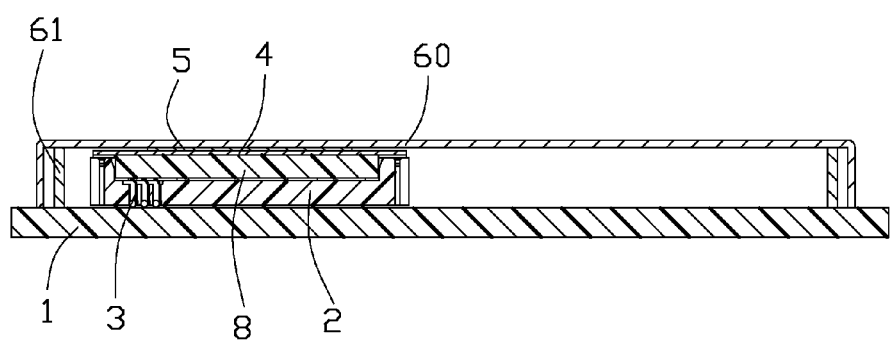
FIG. 5 is a cross-sectional view taken along line 5-5 of FIG. 4.

Referring to FIG. 5, when the CPU 8 is located in the insulative housing 2, the load plate 4 can provide a loading force to the CPU 8 and the shield device 6 can provide another loading force to the CPU 8. Because the upper plate 600 of the shield device 6 may be has a gap with the load plate 4 in a vertical direction, so the thermal pad 5 is provided therebetween. Because the thickness of the thermal pad 5 is based on the size of the gap, of course, the thermal pad 5 having elastic is better. In addition, the thermal pad 5 is also use to dissipate heat and transmit heat for the CPU 8.

Although the present invention has been described with reference to particular embodiments, it is not to be construed as being limited thereto. Various alterations and modifications can be made to the embodiments without in any way departing from the scope or spirit of the present invention as defined in the appended claims. For example, to enhance the loading force imposed upon the load plate and/or the CPU by the shield device, the shield device may be equipped with the spring tang structure applying the loading force on a center area of the load plate.

What is claimed is:

1. An electrical connector assembly for electrically connecting a central processing unit (CPU) to a printed circuit board (PCB), comprising:
    an electrical connector comprising an insulative housing, a plurality of contacts received in the insulative housing, and a load plate mounted upon the insulative housing; and
    a shield device comprising an upper section providing a loading force to the load plate, and side sections located on four sides of the electrical connector.

2. The electrical connector assembly as claimed in claim 1, wherein the shield device includes a cover which is configured by an upper plate and sidewalls.

3. The electrical connector assembly as claimed in claim 2, wherein the shield device further includes a frame configured by vertical sidewalls and located inside of the cover, and the frame and the sidewalls of the cover are commonly formed the side sections of the shield device.

4. The electrical connector assembly as claimed in claim 1, wherein the electrical connector assembly further includes a thermal pad located between the shield device and the load plate.

5. The electrical connector assembly as claimed in claim 1, wherein the load plate includes a solid planar main body and latches disposed at the opposite sides of the main body, each latch includes a connecting portion extending from the main body and a bent portion extending inwardly to a space below the main body.

6. The electrical connector assembly as claimed in claim 5, wherein the bent portion includes an against surface near the connecting portion and an end portion extending away from the space below the main body.

7. The electrical connector assembly as claimed in claim 6, wherein the end portion bent upwardly at the free end for picking the load plate up from the insulative housing.

8. The electrical connector assembly as claimed in claim 5, wherein the insulative housing defines receiving portions to engaging with the latches of the load plate, each receiving portion includes a projection extending outwardly and a notch formed below the projection.

9. The electrical connector assembly as claimed in claim 6, wherein the insulative housing has a projection to engage with the against surface of the latches of the load plate.

10. An electrical connector assembly used for providing loading force to a central processing unit (CPU), comprising:
    a printed circuit board (PCB);
    an electrical connector mounted upon the PCB and comprising an insulative housing, a plurality of contacts received in the insulative housing, and a load plate mounted upon the insulative housing; and
    a shield device mounted on the PCB and cooperated with the PCB to form a closed space to receive the electrical connector therein, the shield device exerting a loading force to the load plate.

11. The electrical connector assembly as claimed in claim 10, wherein a thermal pad is located between the shield device and the load plate.

12. The electrical connector assembly as claimed in claim 10, wherein the insulative housing defines receiving portions to engage with the load plate, each receiving portion includes a projection extending outwardly and a notch formed below the projection.

13. The electrical connector assembly as claimed in claim 12, wherein the load plate includes a solid planar main body and latches disposed at the opposite sides of the main body, each latch includes an against surface to engage with the bottom surface of the projection.

14. An electrical connector assembly comprising:
    a printed circuit board;
    an electrical connector mounted upon a part area of the printed circuit board, said connector including contacts mechanically and electrically connected to the printed circuit board and defining a receiving cavity to receive therein an electronic package mechanically and electrically connected to the printed circuit board;
    a metallic shield device covering most areas of the printed circuit board, said metallic defining a top wall and a plurality of side walls to cooperate with the printed circuit board to form a shielded space in which the connector and other electronic parts on the printed circuit board are received; wherein
    said metallic shield applies a downward force upon the electronic package to assure reliable mechanical and electrical connection between the electronic package and the connector; wherein said connector is further equipped, between the electronic package and the shield device, with a load plate through which said downward force is transferred to the electronic package.

15. The electrical connector assembly as claimed in claim 14, wherein said connector is further equipped with a thermal pad, between the load plate and the shield device, through which said downward force is transferred to the electronic package.

16. The electrical connector assembly as claimed in claim 14, wherein said load plate includes latches to grasp the housing.

* * * * *